United States Patent
Terrovitis

(10) Patent No.: US 7,768,346 B1
(45) Date of Patent: Aug. 3, 2010

(54) SYSTEM FOR AMPLIFIER LINEARIZATION WITH ENVELOPE FEEDBACK

(75) Inventor: Manolis Terrovitis, Foster City, CA (US)

(73) Assignee: Atheros Communications, Inc., Santa Clara, CA (US)

(*) Notice: Subject to any disclaimer, the term of this patent is extended or adjusted under 35 U.S.C. 154(b) by 0 days.

(21) Appl. No.: 12/388,486

(22) Filed: Feb. 18, 2009

(51) Int. Cl.
*H03G 3/20* (2006.01)
(52) U.S. Cl. .................................. 330/136; 330/129
(58) Field of Classification Search ............... 330/136, 330/129, 279
See application file for complete search history.

(56) References Cited

U.S. PATENT DOCUMENTS

| | | | |
|---|---|---|---|
| 6,677,823 B2* | 1/2004 | Terosky et al. | 330/289 |
| 6,683,496 B2* | 1/2004 | Poggi et al. | 330/132 |
| 6,745,016 B2* | 6/2004 | Iwata et al. | 455/234.1 |
| 7,288,988 B2* | 10/2007 | Braithwaite | 330/149 |
| 7,466,195 B2* | 12/2008 | Drogi et al. | 330/136 |

* cited by examiner

*Primary Examiner*—Henry K Choe
(74) *Attorney, Agent, or Firm*—Bever, Hoffman & Harms, LLP; Jeanette S. Harms

(57) ABSTRACT

An amplifier with linearization feedback includes an amplification stage that receives a feedback control signal from an envelope detection feedback network. The envelope detection feedback network controls the gain of the amplification stage based on an envelope of an input signal of the amplification stage, an envelope of an attenuated version of an amplified output signal of the amplification stage, and an offset adjustment signal generated by an offset calibration block. The envelope detection feedback network can include single stage or multiple stage envelope detectors. The amplification stage can include multiple, serially connected amplifiers. The gain of at least one amplifier in the amplification stage may be controlled by the feedback control signal. Additionally, the gain of some of the amplifiers in the amplification stage may be controlled digitally by gain adjustment signals based on comparing the feedback control signal to one or more reference signals.

17 Claims, 8 Drawing Sheets

SYSTEM FOR AMPLIFIER LINEARIZATION WITH ENVELOPE FEEDBACK

CROSS REFERENCE TO RELATED APPLICATION

This application is related to commonly assigned, co-pending application Ser. No. 12/388,477, filed on Feb. 18, 2009, entitled "Multiple Stage Envelope Detector", by Manolis Terrovitis.

BACKGROUND OF THE INVENTION

1. Field of the Invention

The present invention relates to transmit power amplification in general, and more specifically to radio frequency transmit power amplifiers with envelope feedback.

2. Description of the Related Art

High performance communication systems, such as those specified by high data rate IEEE 802.11 wireless standards, may use communication methods with high dynamic range signals. One example communication method known as Orthogonal Frequency Division Multiplexing (OFDM) may produce high dynamic range signals with high peak to average ratios (PARs). Transmit power amplifiers, which may be used to amplify signals before transmission, may need to operate with good linearity over a wide dynamic range of input signals to accommodate a signal's high PAR. Envelope detection may be used to extend the range of good linearity of a transmit power amplifier as described in co-pending application Ser. No. 12/388,477, filed on Feb. 18, 2009, entitled "Multiple Stage Envelope Detector", by Manolis Terrovitis.

FIG. 1 illustrates a prior art linearized transmit amplifier 100 with envelope feedback using two envelope detectors 104. A variable gain power amplifier 103 may be adjusted continuously by a low frequency analog control signal $V_c$. The control signal $V_c$ may be generated by a baseband comparator amplifier 106 that compares an envelope of an input signal $RF_{IN}$ with an envelope of an output signal $RF_{OUT}$ attenuated by a capacitive attenuator 107 with gain $G_{CAP\_ATT}$. The two envelope detectors 104 may be used to extract the envelope from the input signal $RF_{IN}$ and from an attenuated version of the output signal $RF_{OUT}$. Because of the feedback loop provided by the envelope detectors 104, a gain $G_{PA}$ of the linearized power amplifier 103 may be forced to equal the inverse of the gain $G_{CAP\_ATT}$ of the capacitive attenuator 107. Using envelope detection feedback seeks to improve the linearity of the transmit power amplifier 103.

FIG. 2 illustrates an input/output relationship 200 of an input $V_{i,PA}$ and an output $V_{o,PA}$ of a power amplifier based on a prior art "Rapp" model. The shape of the input/output curve in FIG. 2 may be represented by Equation (1).

$$V_{o,PA} = K \frac{V_{i,PA}}{(1 + V_{i,PA}^{2R})^{1/(2R)}} \quad (1)$$

The variables $V_{i,PA}$ and $V_{o,PA}$ in Equation (1) may indicate input and output amplitude voltages respectively, K may represent a linear signal gain, and R may indicate a "Rapp" coefficient. For a Rapp coefficient of R=1, as the input $V_{i,PA}$ increases above a certain level, the amplifier may begin to saturate, thus introducing gain compression where the slope of the input/output curve changes from a constant linear value. Gain compression may also be known as amplitude to amplitude modulation distortion. For increasing Rapp coefficient R values, the input/output relationship in the Rapp model approaches an ideal R=∞ dashed curve and may have a relatively longer region of constant linear gain.

In a typical application, such as an 802.11 wireless transmitter, a transmit power amplifier may be required to "back off" its output power from a maximum saturation power level to ensure a minimum level of performance with an acceptable error vector magnitude. The amount of "back off" required for acceptable performance based on a Rapp model amplifier may depend on the Rapp coefficient. A transmit power amplifier in an 802.11g transmitter operating at 54 Mbps with a Rapp coefficient R=1 may be required to back off by 9.1 dB of power, while an ideal transmit power amplifier with a Rapp coefficient R=∞ may only need to back off by 5.4 dB. An amplifier operating with less power back off may be more power efficient. Thus it is desirable to apply a linearization method to a power amplifier that may result in an input/output relationship with increased linear dynamic range approaching the ideal R=∞ dashed curve in FIG. 2.

FIG. 3 illustrates an input/output relationship 300 for a prior art single stage envelope detector, with a linear dynamic range 307 from $V_{i,LO}$ to $V_{i,HI}$ that may typically extend over 12 to 15 dB of input signal levels. When the input signal $RF_{IN}$ is small, corresponding to $V_{i,ED}=\text{Env}\{RF_{IN}\}<V_{i,LO}$, the envelope $V_{i,ED}$ may be difficult to detect, in which case the linearization feedback loop may not be closed. In this "open loop" case, the control signal $V_c$ into the transmit power amplifier 103 may be not well defined, and the loop gain $G_{PA}$ of the transmit power amplifier 103 may be significantly different from the desired value of $1/G_{CAP\_ATT}$ as shown in FIG. 4. This abrupt gain change may impact the performance of systems that may transmit signals with low level amplitudes. In particular, an OFDM signal for an 802.11 g transmitter may have both a high PAR and a trajectory of the in-phase and quadrature components of the signal that may pass through the origin. Thus, an OFDM signal may have an envelope with both high levels and an instantaneous zero level. Extending the linear dynamic range of a linearized transmit power amplifier over which closed loop operation may operate may provide a desired performance improvement.

SUMMARY OF THE INVENTION

An amplifier with linearization feedback includes an amplification stage that may receive a feedback control signal from an envelope detection feedback network. The envelope detection feedback network may control the gain of the amplification stage based on an envelope of an input signal of the amplification stage, an envelope of an attenuated version of an amplified output signal of the amplification stage, and an offset adjustment signal generated by an offset calibration block. The offset calibration block may generate the offset adjustment signal based on comparing the feedback control signal to an offset reference signal.

The envelope detection feedback network may include single stage or multiple stage envelope detectors. The amplification stage may include multiple, serially connected amplifiers, wherein the gain of at least one amplifier in the amplification stage may be controlled by the feedback control signal. Additionally, the gain of some of the amplifiers in the amplification stage may be controlled digitally by gain adjustment signals generated by a gain adjustment block based on comparing the feedback control signal to one or more reference signals.

DETAILED DESCRIPTION

Figure 5:
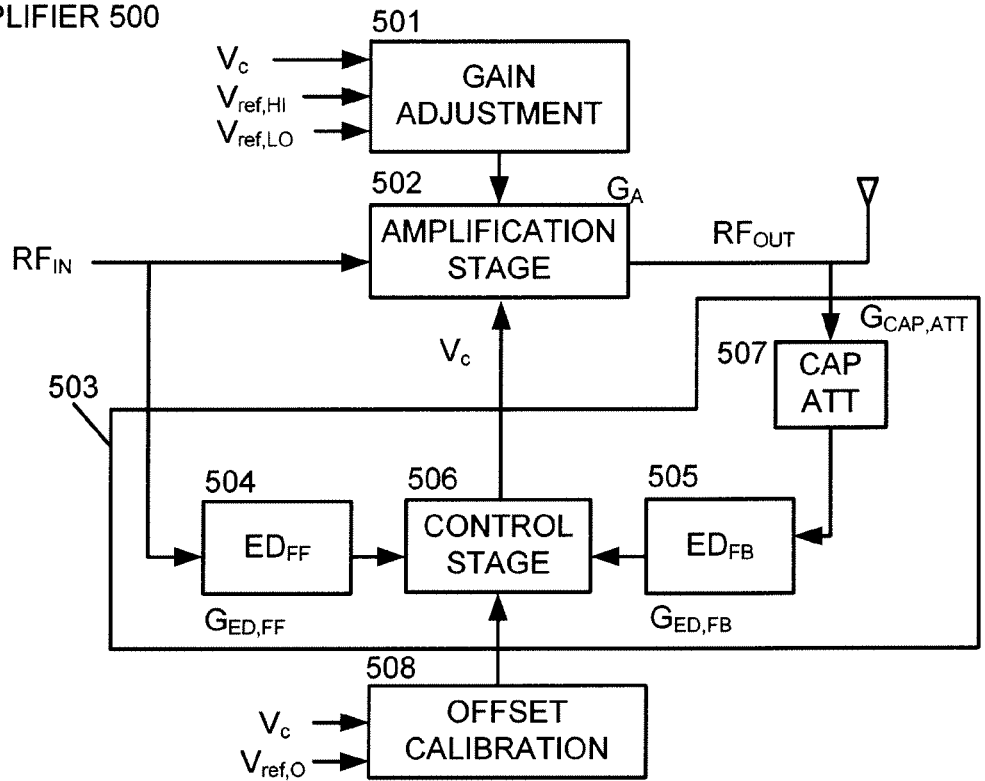
FIG. 5 illustrates an adjustable linearized transmit amplifier with multi-stage envelope detection feedback.

FIG. 5 illustrates an adjustable linearized transmit amplifier 500 with envelope feedback that may offer improved performance and functionality compared with the prior art linearized transmit amplifiers. As discussed in further detail below, an amplification stage 502, which amplifies an input signal $RF_{IN}$ to generate an output signal $RF_{OUT}$, can advantageously include multiple gain controls that may provide improved performance under a variety of operating conditions. An envelope detection feedback network 503 can generate a feedback control signal $V_c$ based on comparing envelopes of the input signal $RF_{IN}$ and the output signal $RF_{OUT}$. The envelope detectors 504 and 505 may include single stage envelope detectors or multi-stage envelope detectors (which could extend the dynamic range over which the adjustable linearized transmit amplifier 500 may operate). The adjustable control stage 506 in the envelope detection feedback network 503 augmented with offset calibration to lower output signal distortion and improve stability of the feedback control signal $V_c$. The text below will explain each of these innovations in greater detail.

In one embodiment, at least one amplifier of the amplification stage 502 may have its gain adjusted digitally in discrete steps by a gain adjustment block 501. In addition, at least one amplifier of the amplification stage 502 may be adjusted continuously by a low frequency analog control signal $V_c$ produced by a control stage 506. The radio frequency output signal $RF_{OUT}$ from the amplification stage 502 may be attenuated by a digitally adjustable capacitive attenuator 507 to produce an attenuated version of the output signal $RF_{OUT}$. A feed-forward envelope detector 504 may accept the radio frequency input signal $RF_{IN}$ and may output a detected envelope of the input signal $RF_{IN}$. Similarly, the feed-back envelope detector 505 may output a detected envelope of an attenuated version of the radio frequency output signal $RF_{OUT}$ produced by the capacitive attenuator 507. The control stage 506 may compare the detected envelopes from the envelope detectors 504 and 505 and may produce an amplified and filtered analog control signal $V_c$ to feed to the amplification stage 502. An offset calibration block 508 may also alter the control signal $V_c$ output by the control stage 506 to counteract offsets in the detected envelopes output from envelope detectors 504 and 505 (or offsets produced in the control stage 506).

Figure 6:
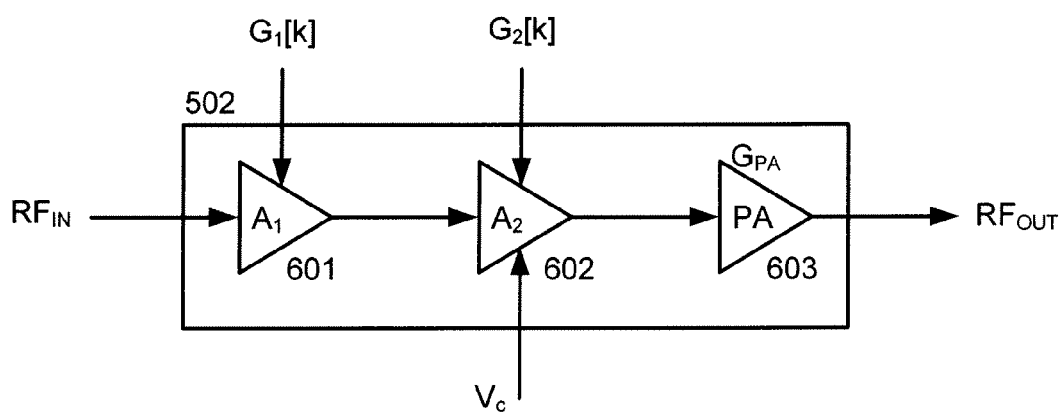
FIG. 6 illustrates an embodiment of an amplification stage for the adjustable linearized transmit amplifier of FIG. 5.

In one embodiment, as shown in FIG. 6, the amplification stage 502 of FIG. 5 with a total forward gain $G_A$ may consist of two pre-amplifiers 601 and 602 connected in series to a transmit power amplifier 603. The gain $G_A$ of the amplification stage 502 may equal the cascaded gains of the pre-amplifier and transmit power amplification stages, i.e. $G_A = G_1[k]G_2[k]G_{PA}$. The pre-amplifier gains $G_1[k]$ and $G_2[k]$ may be digitally programmable set by the gain adjustment stage 501. The feedback gain adjustment of the amplification stage 502 may occur by inputting the control signal $V_c$ to any constituent amplifier in the amplification stage 502. In the embodiment of the amplification stage 502 shown in FIG. 6, the control signal $V_c$ may be input to the pre-amplifier 602. The feed-forward reference signal for the feedback loop in FIG. 5 may use the input from any of the amplifiers of the amplification stage 502. In the embodiment of the amplification stage 502 in FIG. 6, the feedback loop may use the input signal $RF_{IN}$ to the pre-amplifier 601 rather than the pre-amplified input signal into the power amplifier 603.

When the adjustable linearized transmit amplifier 500 operates with closed loop feedback, the closed loop may force the forward gain $G_A$ of the amplification stage 502 to equal the inverse of the gain $G_{ATT,CAP}$ of the capacitive attenuator 507.

$$G_A = G_1[k]G_2[k]G_{PA} = \frac{1}{G_{ATT,CAP}} \quad (1)$$

If the digitally adjustable gains $G_1[k]$ and $G_2[k]$ of the pre-amplifiers 601 and 602 are set very low, then the analog control signal $V_c$ may saturate to a limiting high value, assuming that the gain $G_A$ is an increasing function of the analog control signal $V_c$. Similarly, for very high pre-amplifier gains $G_1[k]$ and $G_2[k]$, the analog control signal $V_c$ may saturate to a limiting low value. If the gain $G_A$ is a decreasing function of the analog control signal $V_c$, then the situation is reversed, with the analog control signal $V_c$ saturating to a limiting low (high) value for low (high) values of the digitally adjustable gains $G_1[k]$ and $G_2[k]$. Thus, the two pre-amplifier gains $G_1[k]$ and $G_2[k]$ may be adjusted in a preferred embodiment to ensure that the control signal $V_c$ remains in a middle range that permits the control signal $V_c$ to vary to accommodate a wide range of input signals $RF_{IN}$ without saturating high or low.

Figure 7:
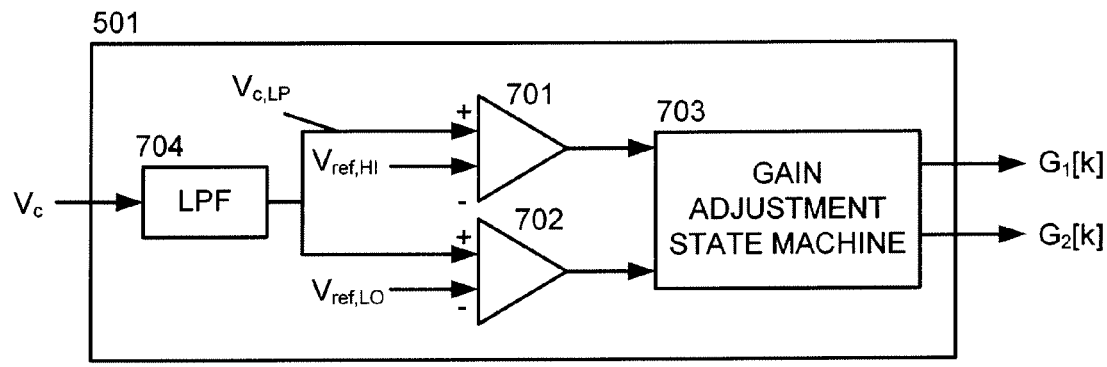
FIG. 7 illustrates an embodiment of the gain adjustment block of FIG. 5.

FIG. 7 illustrates an embodiment of the gain adjustment stage 501 that may output the digital pre-amplifier gains $G_1[k]$ and $G_2[k]$. A low pass filter LPF 704 may filter the analog control signal $V_c$ producing a reference signal $V_{c,LP}$ that may be largely independent of the input signal $RF_{IN}$. The low pass filtered reference signal $V_{c,LP}$ may be compared against a pair of configurable high and low reference values $V_{ref,HI}$ and $V_{ref,LO}$ by a pair of comparator amplifiers 701 and 702. The reference values $V_{ref,HI}$ and $V_{ref,LO}$ may define an acceptable range for the analog control signal $V_c$. A gain adjustment state machine 703 may periodically sample the outputs of the comparator amplifiers 701 and 702, and may adjust the two pre-amplifier gains $G_1[k]$ and $G_2[k]$ so that the analog control signal $V_c$ remains within the acceptable range bounded by the reference values $V_{ref,HI}$ and $V_{ref,LO}$. In a preferred embodiment, the analog control signal $V_c$ may be kept close to the low side of its acceptable range, so that when the envelope of the radio frequency input signal $RF_{IN}$ peaks to a higher value, the analog control signal $V_c$ may rise to increase the gain of the amplification stage 502 to compensate for non-linear compression of the output signal $RF_{OUT}$ by the power amplifier 603. The algorithm to adjust the control signal $V_c$ may resemble a method to maintain the voltage of a frequency synthesizer within its optimal range by adding or subtracting discrete capacitor units to a voltage control oscillator LC tank.

Figure 10A:
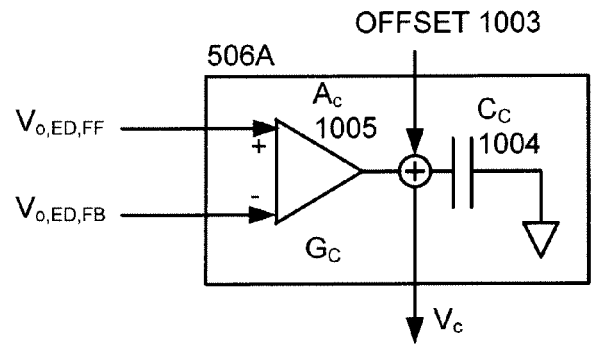
FIG. 10A illustrates an embodiment of a control stage for the adjustable linearized transmit amplifier of FIG. 5.

In one embodiment, the feedback loop of the adjustable linearized transmit amplifier 500 of FIG. 5 includes the amplification stage 502 (with gain $G_A$), the capacitive attenuator 507 (with gain $G_{CAP,ATT}$), the feedback envelope detector 505 (with gain $G_{ED,FB}$), and a comparator amplifier 1005 inside the control stage 506 (with gain $G_C$) (the last as shown in FIG. 10A). In this case, a gain of the feedback loop $A_{Loop}$ may be computed as follows.

$$A_{Loop} = G_c \frac{dV_o}{dV_c} G_{CAP,ATT} G_{ED,FB} \quad (2)$$

where $$\frac{dV_o}{dV_c}$$

may be the incremental change $dV_o$ in the envelope of the radio frequency output signal $RF_{OUT}$ caused by an incremental change $dV_c$ in the control signal $V_c$. The gain $G_{ED,FB}$ of the feedback envelope detector 505 may be defined as the ratio of an incremental change of its output divided by an incremental change in the envelope of a radio frequency signal at its input. As the gain $G_A$ of the amplification stage 502 may link the input and output signals as $RF_{OUT}=G_A RF_{IN}$. Equation (2) may then be written as $$A_{Loop} = V_i G_c \frac{dG_A}{dV_c} G_{CAP,ATT} G_{ED,FB} \quad (3)$$

where $V_i$ may denote the envelope of the radio frequency input signal $RF_{IN}$. Equation (3) indicates that the feedback loop gain $A_{Loop}$ may be proportional to the input signal's envelope $V_i$. If a frequency response of the comparator amplifier 1005 in the control stage 506 consists of a dominant pole, one may show that the bandwidth of the feedback loop may also be proportional to the input signal's envelope $V_i$.

$$BW \approx V_i \frac{dG_A}{dV_c} G_{CAP,ATT} G_{ED,FB} \quad (4)$$

When the feedback loop is closed, the gain $G_A$ of the amplification stage 502 may be set to the inverse of the gain $G_{CAP,ATT}$ of the capacitive attenuator 507, i.e. $G_A=1/G_{CAP,ATT}$. In this closed loop case, Equation (4) may be written as $$BW \approx V_i G_{ED,FB} \left[ \frac{1}{G_A} \frac{dG_A}{dV_c} \right] \quad (5)$$

The quantity inside the square brackets in Equation (5) may be constant if the gain $G_A$ of the amplification stage 502 is an exponential function of the control signal $V_c$. For example if $G_A = K_A e^{V_c/\phi}$, where $K_A$ and $\phi$ may be constants; then $$\frac{dG_A}{dV_c} = \frac{1}{\Phi} G_A,$$

and the quantity $$\frac{1}{G_A} \frac{dG_A}{dV_c} = \frac{1}{\Phi},$$

a constant. Thus, if the gain $G_A$ is an exponential function of the control signal $V_c$, then the bandwidth of the closed loop may be independent of both the gain $G_A$ and the control signal $V_c$.

Figure 1:
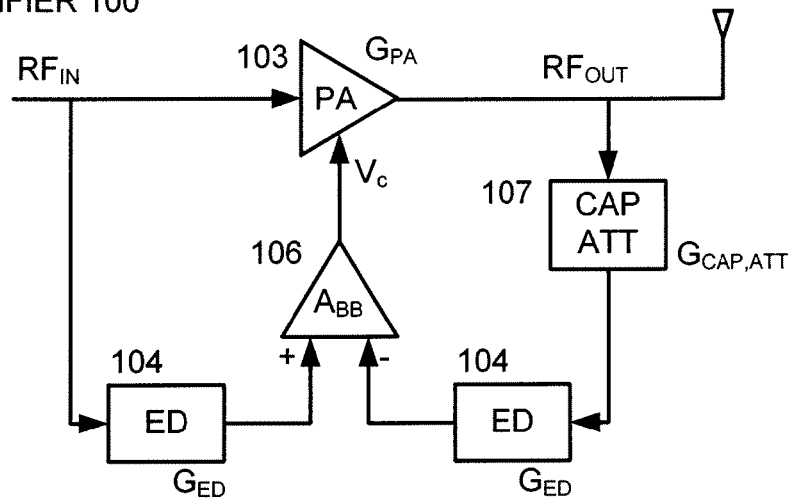
FIG. 1 illustrates a prior art application of an envelope detector in a linearized transmit power amplifier.
Figure 2:
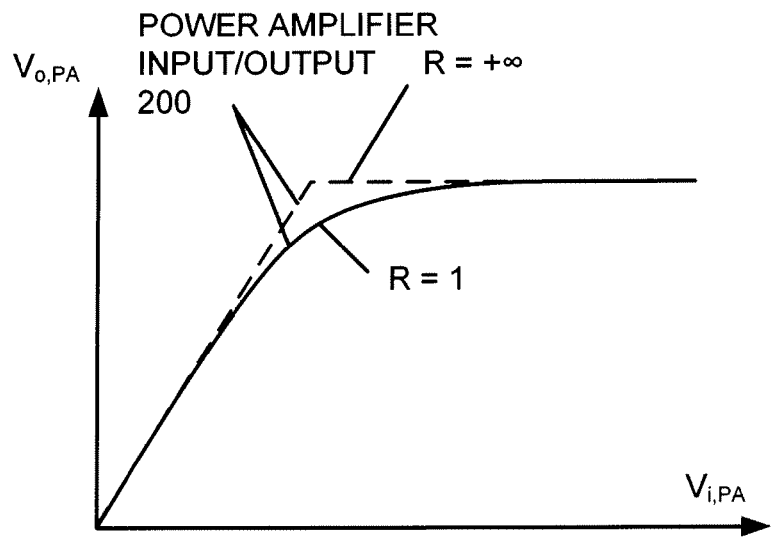
FIG. 2 illustrates an input/output relationship of a prior art Rapp model for a power amplifier.
Figure 3:
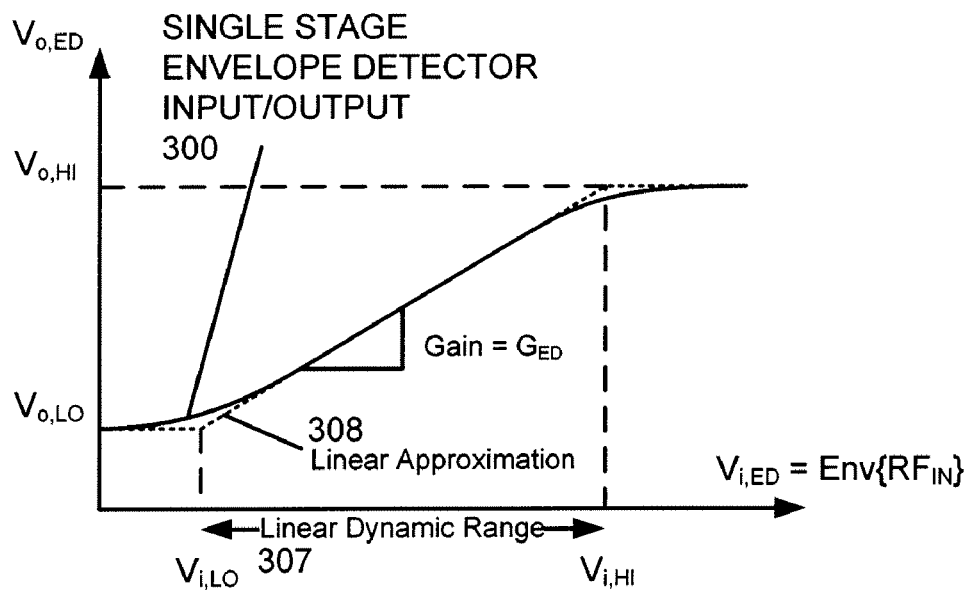
FIG. 3 illustrates an input/output relationship for a prior art single stage envelope detector.
Figure 8:
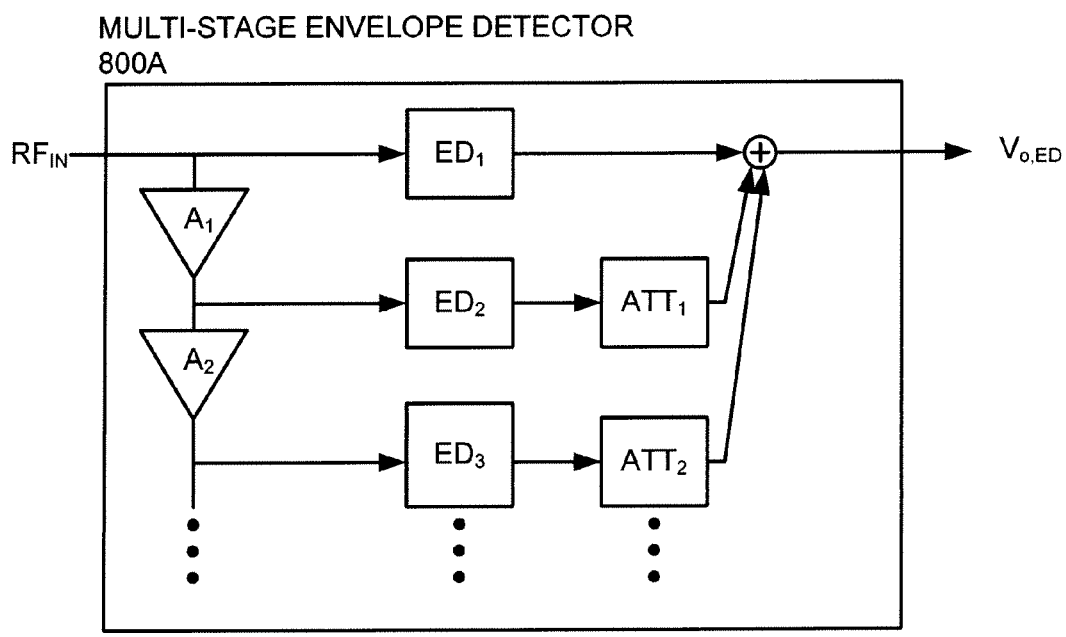
FIG. 8 illustrates an embodiment of a multi-stage envelope detector.
Figure 9:
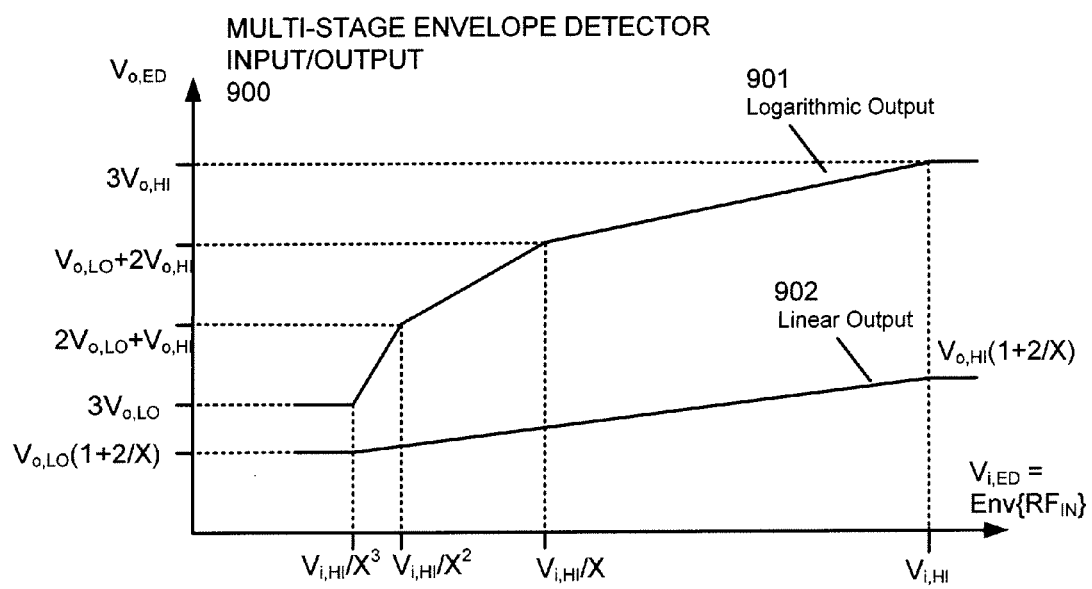
FIG. 9 illustrates two input/output relationships of the multi-stage envelope detector of FIG. 8.

The feed-forward and feedback envelope detectors 504 and 505 may include multiple stages of amplification as shown in FIG. 8 and described in co-pending application Ser. No. 12/388,477, filed on Feb. 18, 2009, entitled "Multiple Stage Envelope Detector", by Manolis Terrovitis, incorporated by reference herein. FIG. 9 illustrates an input/output relationship 900 of a multi-stage envelope detector 800A of FIG. 8 that may span a broader range of input signal levels than the single stage envelope detector 104 used in the prior art linearized transmit amplifier 100 of FIG. 1. Depending on the gains of the constituent amplifiers $A_1$, $A_2$, etc. and attenuators $ATT_1$, $ATT_2$, etc. the input/output relationship 900 may approximate a logarithmic curve 901 or a linear curve 902. For the logarithmic curve 901, the input/output relationship 900 may be approximated as a continuous logarithmic response $$V_o = K_1 \ln\left(\frac{V_i}{\Phi_1}\right) + C \quad (6)$$

where $K_1$, $\phi_1$ and C may be constants with appropriate units. A gain of a multi-stage envelope detector 800A with a response as in Equation (6) may equal $$G_{ED,MS} = \frac{dV_o}{dV_i} = \frac{K_2}{V_i} \quad (7)$$

where $K_2$ may also be a constant. In Equation (7), the gain $G_{ED,MS}$ may be inversely proportional to the envelope $V_i$ of the input signal $RF_{IN}$. Thus, when a logarithmically shaped multi-stage envelope detector may be used as envelope detectors in FIG. 5, the bandwidth of the feedback loop expressed in Equation (5) may be independent of the envelope $V_i$ of the radio frequency input signal $RF_{IN}$. In fact, as described for Equation (5) above, when combining a logarithmically shaped multi-stage envelope detector in the feedback path (as an embodiment of envelope detector 505) with an exponentially shaped amplification stage in the feed-forward path (as an embodiment of the pre-amplifier 602 in the amplification stage 502), the bandwidth of the feedback loop of the adjustable linearized transmit amplifier 500 may be constant.

FIG. 10A illustrates an embodiment 506A of the control stage 506 that may pair with embodiments of the multi-stage envelope detector illustrated in FIG. 8. A comparator amplifier 1005 with gain $G_c$ may combine a detected envelope $V_{o,ED,FF}$ from the feed-forward envelope detector 504 with a detected envelope $V_{o,ED,FB}$ from the feedback envelope detector 505. An output of the comparator amplifier 1005 may be combined with an offset adjustment signal 1003 from the offset calibration block 508 resulting in the control signal $V_c$. The control signal $V_c$ output by the comparator amplifier 1005 may be maintained at a minimum error level by a compensation capacitor 1004, even when the input signals $V_{o,ED,FF}$ and $V_{o,ED,FB}$ to the comparator amplifier 1005 may be very low.

Figure 11:
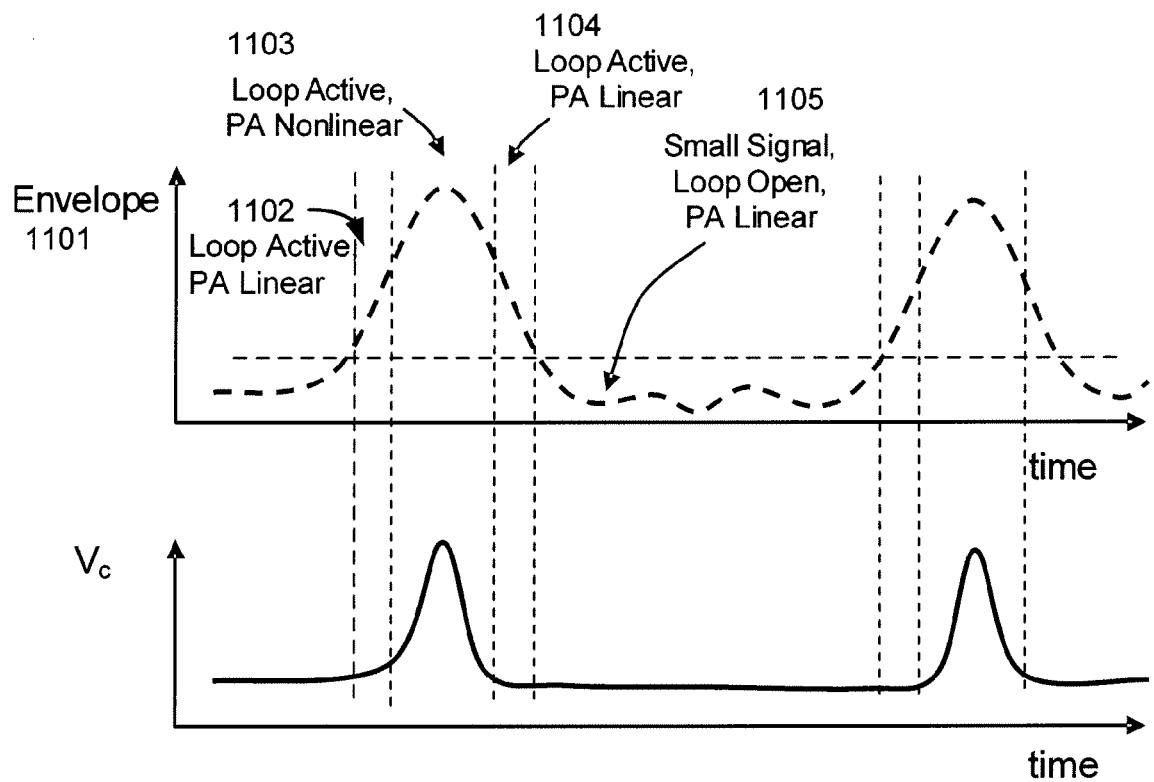
FIG. 11 illustrates a correspondence between an envelope of a radio frequency input signal $RF_{IN}$ and the control signal $V_c$ for the adjustable linearized transmit amplifier of FIG. 5.

FIG. 11 illustrates a correspondence between an envelope of the radio frequency input signal $RF_{IN}$ and the control signal $V_c$. As the envelope rises, the feedback loop becomes active (i.e. closed loop operation) and the control signal $V_c$ begins to rise (region 1102). When the input signal's envelope increases beyond the linear range of the power amplifier 603 in the amplification stage 502, the control signal Vc may increase rapidly (region 1103) to compensate for the non-linearity induced by the power amplifier's gain compression. As the input signal's envelope decreases, the control signal $V_c$ may also decrease rapidly (region 1103) and then may settle near a constant level (region 1104) aided by the compensation capacitor 1004 in control stage 506. Because the feedback loop may be active when the power amplifier operates in a linear range (region 1104), the control signal $V_c$ may settle at an appropriate value to ensure the forward gain of the amplification stage $G_A$ equals the inverse of the capacitive attenuator gain $G_{CAP,ATT}$. When the input signal's envelope decreases even further, the feedback loop may open (region 1105). In this open loop region, small offsets of the feedback loop may cause the control signal $V_c$ to drift; however, offset calibration as described below may reduce any distortion introduced to the radio frequency output signal $RF_{OUT}$. In a preferred embodiment one may also minimize the time when the input signal's envelope may be undetectable.

Figure 10B:
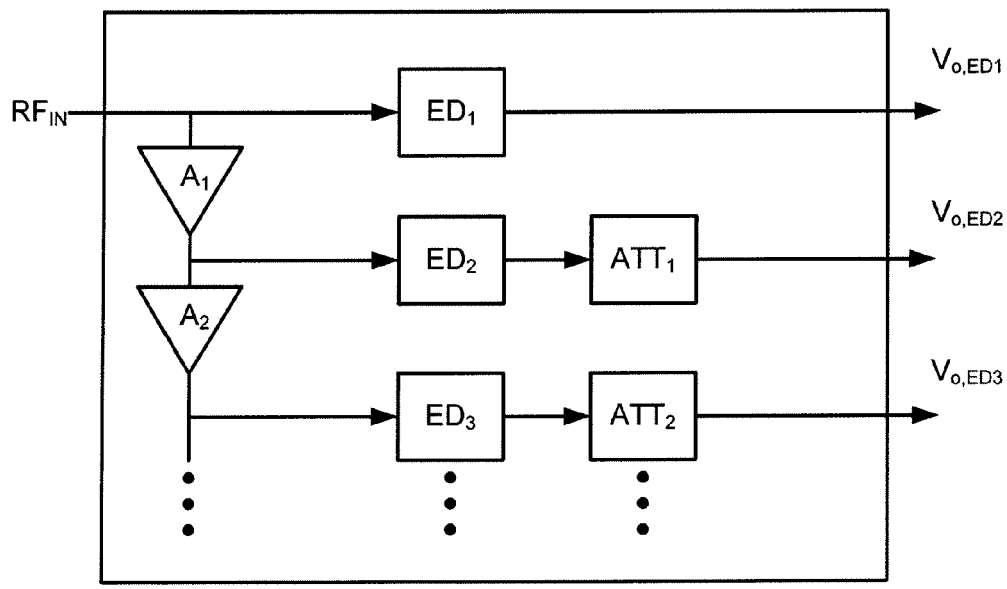
FIG. 10B illustrates an alternative embodiment of a multi-stage envelope detector for the adjustable linearized transmit amplifier in FIG. 5.
Figure 10C:
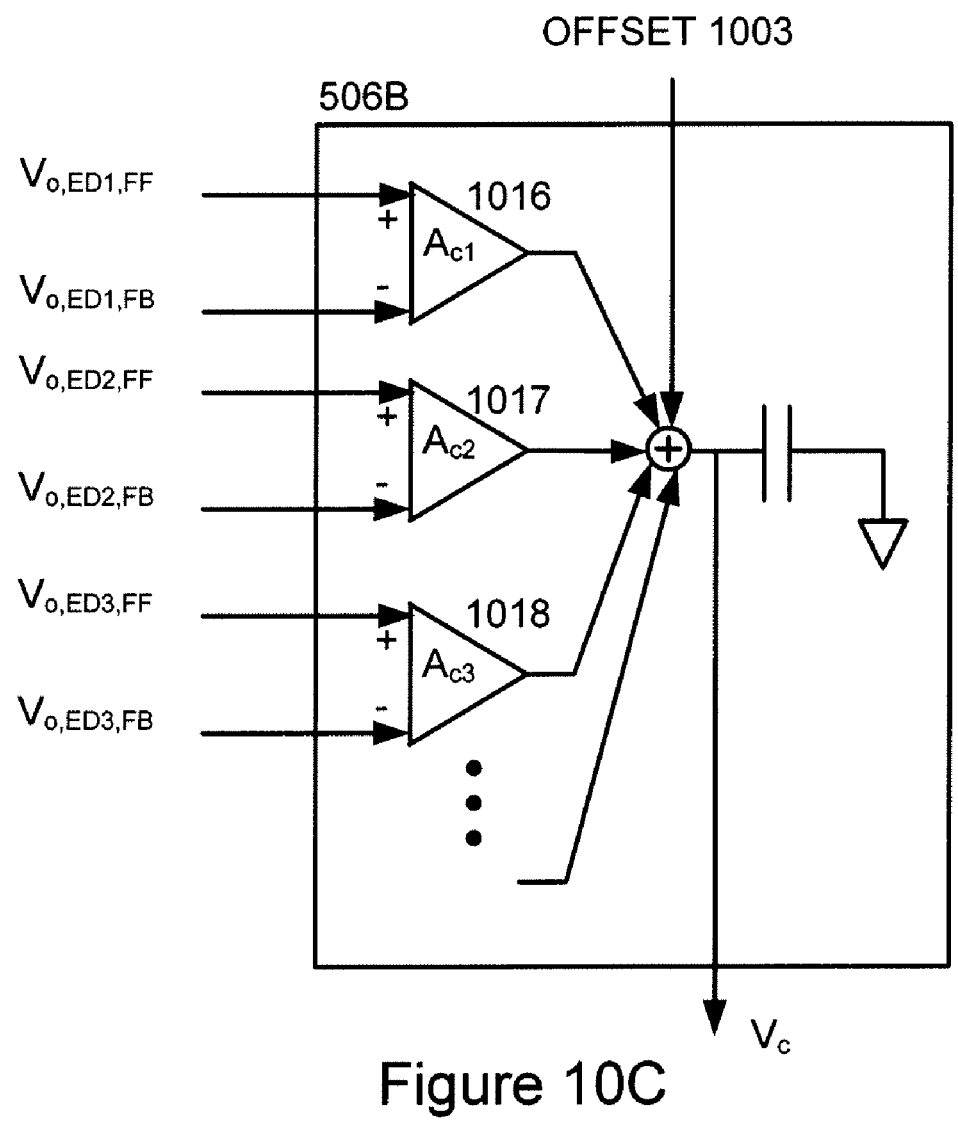
FIG. 10C illustrates an alternative embodiment of the control stage for the adjustable linearized transmit amplifier in FIG. 5 to be used with the multi-stage envelope detector of FIG. 10B.

FIG. 10B illustrates an alternative embodiment of a multi-stage envelope detector 500B that outputs a set of detected envelopes $V_{o,ED1}$, $V_{o,ED2}$, $V_{o,ED3}$, etc. that may be generated from amplifications of the radio frequency input signal $RF_{IN}$. An embodiment of the adjustable linearized transmit amplifier 500 of FIG. 5 may use the alternative architecture multi-stage envelope detectors 500B of FIG. 10B with an embodiment of the control stage 506B illustrated in FIG. 10C. Rather than one comparator amplifier 1005, as in FIG. 10A, with which to combine a pair of detected envelopes, the embodiment of FIG. 10C includes a set of comparator amplifiers 1016, 1017, 1018 that may combine a set of detected envelopes produced by feed-forward and feedback envelope detectors using the alternative embodiment multi-stage envelope detector illustrated in FIG. 10B. Combining the envelope detectors of FIG. 8 with the comparator stage of FIG. 10A, or using the envelope detectors of FIG. 10B with the comparator stage of FIG. 10C, may produce similar results.

By using the radio frequency input signal $RF_{IN}$, rather than the input to the power amplifier 603, as the reference signal for the feedback loop in the adjustable linearized transmit amplifier 500, one may linearize the entire amplification stage 502 rather than the power amplifier 603 alone. The gains $G_1[k]$ and $G_2[k]$ of the pre-amplifiers 602 and 603 may be adjusted in discrete steps digitally to absorb process and temperature gain variation as well as accommodate the programmable closed loop gain implemented by adjusting the capacitive attenuator gain $G_{CAP,ATT}$. A mixing operation that may generate the radio frequency input signal $RF_{IN}$ from a baseband input signal may result in a small amount of common mode carrier feed-through in $RF_{IN}$. This common mode carrier feed-through may be independent of the baseband input signal and may result in a small DC offset at the output of the envelope detectors that may be calibrated. As the multi-stage envelope detectors 504 and 505 may not offer common mode rejection, the offset calibration block 508 may detect the DC offset and compensate accordingly.

Figure 4:
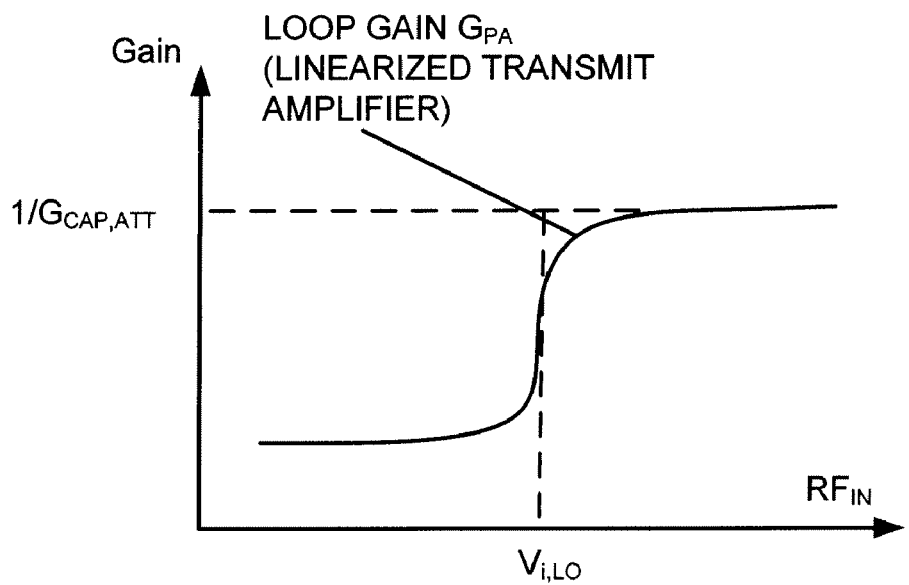
FIG. 4 illustrates a loop gain of the linearized transmit amplifier of FIG. 1 for inputs with low signal amplitude.

There may be several sources of offset, besides the local oscillator feed-through from the mixer described above, that appear at the control stage 506 of the adjustable linearized transmit amplifier 500. For example, a mismatch between the feed-forward envelope detector 504 in the feed-forward reference path and the feedback envelope detector 505 in the feedback path may occur. In addition, input stages within the comparator amplifier 1005 in FIG. 10A, or within the set of comparator amplifiers 1016, 1017, 1018 in FIG. 10C, for the control stage 506 may be imperfectly matched. This offset may affect the performance of the adjustable linearized transmit amplifier 500 because the offset may appear on the envelope of the radio frequency output signal $RF_{OUT}$ resulting in distortion. The offset may also dominate envelope detection when the envelope of the signal may be small, i.e. below the detection level of the envelope detectors, resulting in the control signal Vc swinging to a high or low value, thereby changing significantly the small signal gain as shown in FIG. 4. This non-linear change in the loop gain may generate signal distortion. Offset calibration may mitigate these performance issues.

Figure 12:
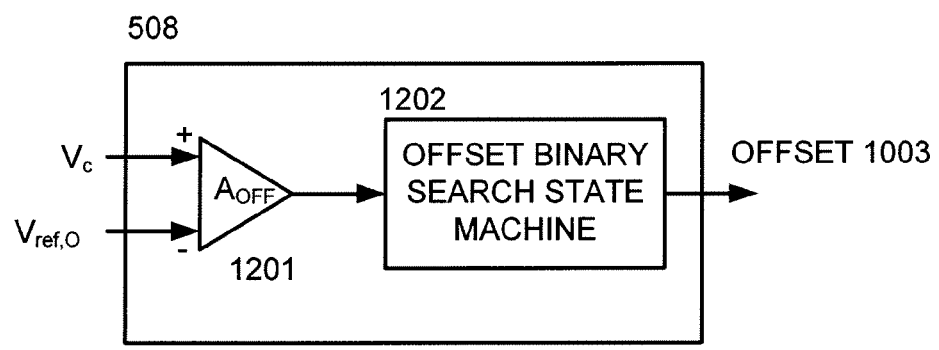
FIG. 12 illustrates an embodiment of the offset calibration block of FIG. 5.

As illustrated in FIG. 12, a comparator amplifier 1201 in the offset calibration block 508 may calculate a difference between the control signal $V_c$ and an offset reference $V_{ref,O}$. When the radio frequency input signal $RF_{IN}$ may be small (or not present), an offset binary search state machine 1202 in the offset calibration block 508 may search for a value for the offset adjustment signal 1003 that minimizes the difference between the control signal $V_c$ and the offset reference $V_{ref,O}$. Alternatively the offset binary search state machine 1202 may search for a value for the offset adjustment signal 1003 that forces the difference between the control signal $V_c$ and the offset reference $V_{ref,O}$ below a pre-determined threshold. This offset calibration may determine and compensate for the cumulative effect of various offsets described above. The offset binary search state machine 1202 may be implemented in hardware or software. A hardware implementation may be preferred for quick, periodic offset calibration results. In some embodiments, the comparator amplifier 1201 in the offset calibration block 508 may be used non-concurrently as one of the comparator amplifiers (701 or 702 in FIG. 7) in the gain adjustment block 501 of the adjustable linearized transmit amplifier 500 to minimize hardware required.

In the embodiment of the amplification stage 502 shown in FIG. 6, the control signal $V_c$ may alter the forward gain through the pre-amplifier 602. Alternatively, the gain adjustment of the forward path may occur by adjusting any of the radio frequency amplifiers 601, 602 or 603 in the amplification stage 502. Balancing several design goals may influence which amplifier may accept the control signal $V_c$ and also may affect that amplifier's design. In a preferred embodiment, any phase distortion introduced to the radio frequency output signal $RF_{OUT}$ by changing the control signal $V_c$ may be minimized by an appropriate design of the amplifier in the amplification stage 502 that accepts the control signal $V_c$. One may adjust the forward gain closer to the power amplifier 603 to minimize the feedback loop delay and thereby improve loop stability. One may also implement the gain adjustment in a manner that minimizes power consumption when the control signal Vc may be low; for example, gain stages with less amplification may dissipate less current.

For the embodiment of the amplification stage 502 illustrated in FIG. 6, the bandwidth of the feedback loop of Equation (5) may become $$BW \approx V_i G_{ED,FB} \left[ \frac{1}{G_2[k]} \frac{dG_2[k]}{dV_c} \right]. \quad (8)$$

$G_2[k]$ may represent the gain of the second pre-amplifier 602 and $G_{ED,FB}$ may represent the small signal gain of the feedback envelope detector 505. The feedback loop bandwidth in Equation (8) may be independent of the closed loop gain $1/G_{CAP,ATT}$ if the bracketed term is constant. As shown earlier, this constant property may hold true if the pre-amplifier gain $G_2[k]$ is exponentially proportional to the control signal $V_c$. Note also that as the envelope $V_i$ of the radio frequency input signal $RF_{IN}$ decreases, the bandwidth in Equation (8) may also decrease; however, the gain of the feedback envelope detector $G_{ED,FB}$ may increase to compensate for the decreasing envelope $V_i$. As shown for the logarithmic shaped input/output curve 901 in FIG. 9, the slope (i.e. gain) of the multi-stage envelope detector's input/output curve 901 may increase as the envelope $V_{i,ED} = \text{Env}\{RF_{IN}\}$ decreases balancing each other.

Although illustrative embodiments of the invention have been described in detail herein with reference to the accompanying figures, it is to be understood that the invention is not limited to those precise embodiments. The embodiments described herein are not intended to be exhaustive or to limit the invention to the precise forms disclosed. As such, many modifications and variations will be apparent. Accordingly, it is intended that the scope of the invention be defined by the following Claims and their equivalents.

The invention claimed is:

1. An apparatus with linearization feedback, the apparatus including:
    an amplification stage configured to provide a gain to an input signal and to produce an amplified output signal, wherein the amplification stage includes an interface configured to receive a feedback control signal;
    an envelope detection feedback network coupled to the amplification stage configured to adjust the feedback control signal, wherein the envelope detection feedback network includes a first interface configured to receive the input signal, a second interface configured to receive the amplified output signal, and a third interface configured to receive an offset adjustment signal, the envelope detection feedback network controlling the gain of the amplification stage based on an envelope of the input signal, an envelope of an attenuated version of the amplified output signal, and the offset adjustment signal; and
    an offset calibration block including a first interface configured to receive the feedback control signal and a second interface configured to receive an offset reference signal, the offset calibration block generating the offset adjustment signal based on comparing the feedback control signal and the offset reference signal.

2. The apparatus of claim 1, wherein the envelope detection feedback network includes:
    a first envelope detection block configured to detect and output the envelope of the input signal;
    an attenuator configured to produce the attenuated version of the output signal;
    a second envelope detection block configured to detect and output the envelope of the attenuated version of the output signal; and
    a control stage configured to generate the feedback control signal based on a difference between the envelope of the input signal and the envelope of the attenuated version of the output signal.

3. The apparatus of claim 2, wherein the control stage includes:
    a differential amplifier configured to generate an amplified difference between the envelope of the input signal and the envelope of the attenuated version of the output signal; and
    an apparatus configured to combine the amplified difference and the offset adjustment signal, and to generate the feedback control signal.

4. The apparatus of claim 3, wherein the control stage further includes:
    a compensation capacitor configured to maintain the feedback control signal at a non-zero level when the amplified difference approaches zero.

5. The apparatus of claim 2, wherein the first envelope detector is a multi-stage envelope detector and the second envelope detector is a multi-stage envelope detector.

6. The apparatus of claim 1, wherein the amplifier stage includes a plurality of amplifiers connected serially and the control signal changes the gain of one of the plurality of amplifiers.

7. The apparatus of claim 2, wherein the envelope detection feedback network controls the gain of the amplification stage to be substantially the same as an inverse of an attenuation gain of the attenuator.

8. The apparatus of claim 6, wherein each amplifier in the plurality of amplifiers in the amplification stage is a radio frequency amplifier.

9. The apparatus of claim 1, further including:
    a gain adjustment block configured to output one or more gain adjustment signals, wherein each gain adjustment signal controls a gain of an amplifier in the amplification stage.

10. The apparatus of claim 9, wherein the amplification stage includes one or more pre-amplifiers connected serially to a power amplifier, and each gain adjustment signal couples to the one of the one or more pre-amplifiers, and the feedback control signal couples to one of the one or more pre-amplifiers or to the power amplifier.

11. The apparatus of claim 9, wherein the gain adjustment block includes:
- a low pass filter configured to output a filtered version of the control signal;
- a first comparator configured to calculate a first difference between the filtered version of the control signal and a first reference signal;
- a second comparator configured to calculate a second difference between the filtered version of the control signal and a second reference signal; and
- a gain adjustment state machine configured to determine the one or more gain adjustment signals based on the first difference and the second difference.

12. The apparatus of claim 1, wherein the offset calibration block generates the offset adjustment signal based on an amplified difference between the feedback control signal and the offset reference signal.

13. The apparatus of claim 12, wherein the offset calibration block includes an offset binary search state machine configured to determine the offset reference signal as an offset for which the amplified difference between the feedback control signal and the offset reference signal is below a pre-determined threshold.

14. The apparatus of claim 1, wherein the apparatus is implemented in a wireless transceiver.

15. The apparatus of claim 1, wherein the apparatus is implemented in a wireless device that uses a communication method with non-constant envelope.

16. The apparatus of claim 1, wherein the apparatus is implemented in a wireless transceiver that uses orthogonal frequency division multiplexing.

17. The apparatus of claim 1, wherein the apparatus is implemented in a wireless transceiver that uses an IEEE 802.11 protocol.

* * * * *